(12) United States Patent
Kutsukake et al.

(10) Patent No.: US 7,119,413 B2
(45) Date of Patent: Oct. 10, 2006

(54) HIGH-VOLTAGE TRANSISTOR HAVING SHIELDING GATE

(75) Inventors: Hiroyuki Kutsukake, Yokohama (JP); Kikuko Sugimae, Yokohama (JP); Takeshi Kamigaichi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 114 days.

(21) Appl. No.: 10/967,128

(22) Filed: Oct. 19, 2004

(65) Prior Publication Data
US 2006/0038232 A1    Feb. 23, 2006

(30) Foreign Application Priority Data
Aug. 19, 2004    (JP)    ............. 2004-239593

(51) Int. Cl.
*H01L 29/00* (2006.01)
(52) U.S. Cl. .................. 257/508; 257/368; 257/506
(58) Field of Classification Search ......... 257/499–509
See application file for complete search history.

(56) References Cited

U.S. PATENT DOCUMENTS 6,333,548 B1 * 12/2001 Yamane et al. ............. 257/652

2004/0104436 A1 * 6/2004 Walker et al. ............. 257/355

FOREIGN PATENT DOCUMENTS

| JP | 4-92449 | 3/1992 |
|---|---|---|
| JP | 4-199658 | 7/1992 |

* cited by examiner

*Primary Examiner*—Hoai Pham
*Assistant Examiner*—Mursalin B. Hafiz
(74) *Attorney, Agent, or Firm*—Oblon, Spivak, McClelland, Maier & Neustadt, P.C.

(57) ABSTRACT

A semiconductor device includes a plurality of high-voltage insulated-gate field-effect transistors arranged in a matrix form on the main surface of a semiconductor substrate and each having a gate electrode, a gate electrode contact formed on the gate electrode, and a wiring layer which is formed on the gate electrode contacts adjacent in a gate-width direction to electrically connect the gate electrodes arranged in the gate-width direction. And the device includes shielding gates provided on portions of an element isolation region which lie between the transistors adjacent in the gate-width direction and gate-length direction and used to apply reference potential or potential of a polarity different from that of potential applied to the gate of the transistor to turn on the current path of the transistor to the element isolation region.

5 Claims, 7 Drawing Sheets

HIGH-VOLTAGE TRANSISTOR HAVING SHIELDING GATE

CROSS-REFERENCE TO RELATED APPLICATIONS

This application is based upon and claims the benefit of priority from prior Japanese Patent Application No. 2004-239593, filed Aug. 19, 2004, the entire contents of which are incorporated herein by reference.

BACKGROUND OF THE INVENTION

1. Field of the Invention

This invention relates to a semiconductor device and more particularly to a high-voltage transistor or the like provided in a core portion of the row decoder of a NAND flash memory, for example.

2. Description of the Related Art

Conventionally, for example, in high-voltage transistors and the like, electric lines of force extend into the element isolation insulating film disposed between the adjacent transistors to make unstable the potentials of the gate and source/drain of the adjacent transistor. In this state, if a high-voltage is applied, an inversion layer occurs in the interface between the element isolation insulating film and the semiconductor substrate and extends to the adjacent transistor. As a result, a phenomenon that a current flows between the transistors, that is, a so-called field inversion occurs.

In order to prevent occurrence of the field inversion, it is necessary to increase the depth of the element isolation insulating film disposed between the high-voltage transistors and the distance between the transistors. Therefore, it is disadvantageous for miniaturization.

For example, in FIG. 3(d) of Jpn. Pat. Appln. KOKAI Publication No. 4-199658, an example is disclosed in which an isolation transistor is provided between adjacent high-voltage transistors and elements are isolated by cutting off the isolation transistor to prevent occurrence of field inversion.

However, in the above example, it is necessary to provide the isolation transistors, and therefore, the area is increased due to the presence of the isolation transistors and it is still disadvantageous for miniaturization.

BRIEF SUMMARY OF THE INVENTION

According to an aspect of the present invention, there is provided a semiconductor device comprising a plurality of high-voltage insulated-gate field-effect transistors arranged in a matrix form on a main surface of a semiconductor substrate and each having a gate electrode, a gate electrode contact formed on the gate electrode, and a wiring layer which is formed on the gate electrode contacts adjacent in a gate-width direction to electrically connect the gate electrodes in the gate-width direction; and shielding gates which are provided on an element isolation region in spaces between the transistors adjacent in the gate-width direction and gate-length direction and used to apply one of reference potential and potential of a polarity different from that of potential applied to the gate of the transistor to turn on a current path of the transistor to the element isolation region.

According to another aspect of the present invention, there is provided a semiconductor device comprising a plurality of high-voltage insulated-gate field-effect transistors arranged in a matrix form on a main surface of a semiconductor substrate and having gate electrodes formed to extend in a gate-width direction, the transistors arranged in the gate-width direction commonly having a corresponding one of the gate electrodes; and shielding gates provided on portions of an element isolation region which lie between the transistors adjacent in the gate-width direction and gate-length direction and are different from portions of the element isolation region on which the gate electrodes are formed and used to apply one of reference potential and potential of a polarity different from that of potential applied to the gate of the transistor to turn on a current path of the transistor to the element isolation region.

According to still another aspect of the present invention, there is provided a semiconductor device comprising a plurality of high-voltage insulated-gate field-effect transistors arranged in a matrix form on a main surface of a semiconductor substrate and each having a gate electrode, a gate electrode contact formed on the gate electrode, and a wiring layer which is formed on the gate electrode contacts adjacent in a gate-width direction to electrically connect the gate electrodes in the gate-width direction; and shielding gates provided on portions of an element isolation region which lie between the transistors adjacent in the gate-width direction and used to apply one of reference potential and potential of a polarity different from that of potential applied to the gate of the transistor to turn on a current path of the transistor to the element isolation region.

DETAILED DESCRIPTION OF THE INVENTION

There will now be described embodiments of this invention with reference to the accompanying drawings. In this explanation, common reference symbols are attached to like portions throughout the drawings.

[First Embodiment]

Figure 1:
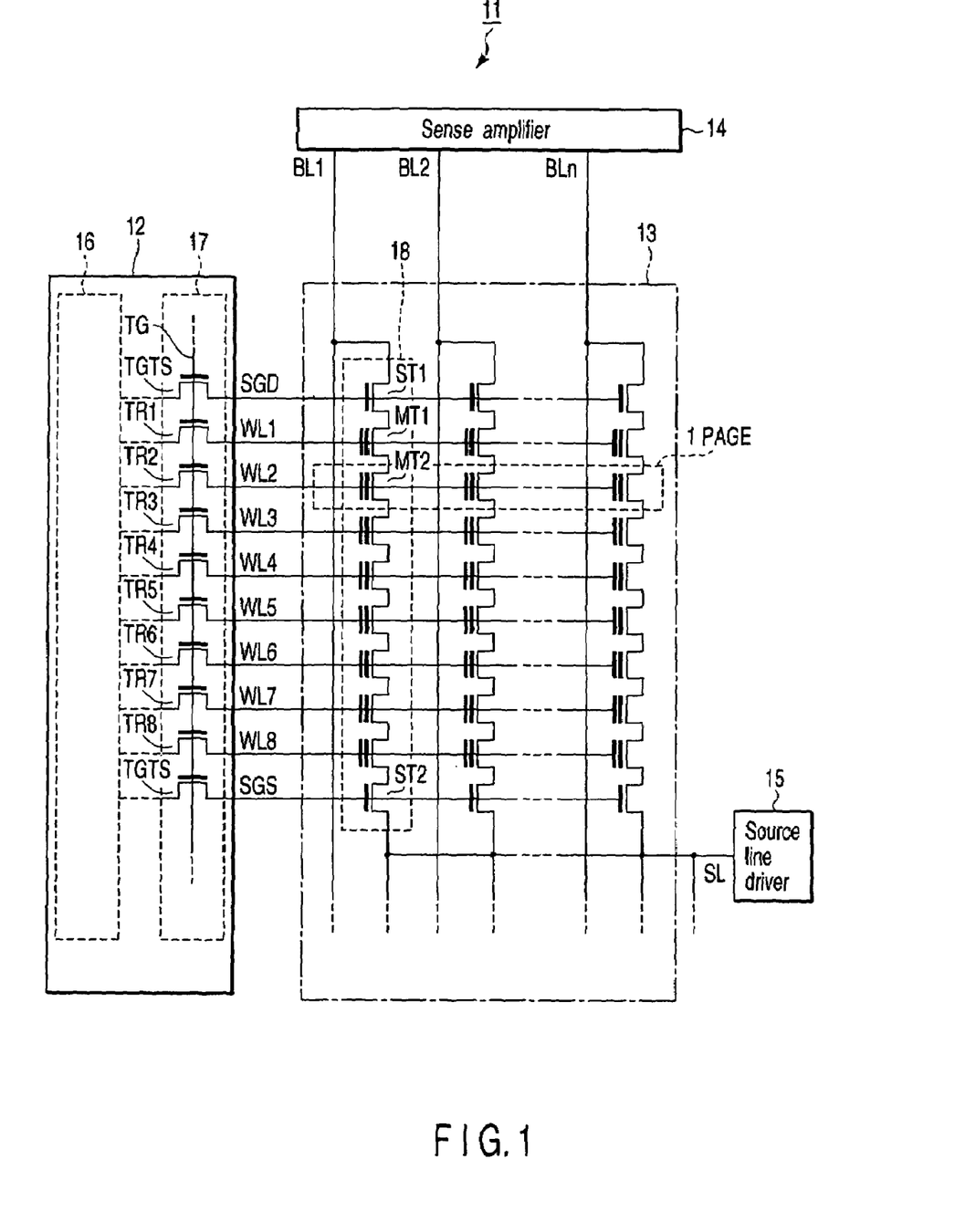
FIG. 1 is a plan view schematically showing a semiconductor device according to a first embodiment of this invention.

First, a semiconductor device according to a first embodiment of this invention is explained with reference to FIGS. 1 to 6 by taking a NAND flash memory as an example. FIG. 1 is a plan view schematically showing a memory cell array and a peripheral circuit thereof in the NAND flash memory.

As shown in FIG. 1, a NAND flash memory 11 includes a row decoder 12, memory cell array 13, sense amplifier 14 and source line driver 15.

The row decoder 12 is configured to select one of word lines WL1 to WL8 and selection select gate lines SGD, SGS. Further, the row decoder 12 includes a row main decoder circuit portion 16 and core portion (row sub decoder portion) 17. The row main decoder circuit portion 16 decodes a row address signal to supply a row address decode signal to the core portion 17. The core portion 17 includes transfer gate transistors TGTD, TGTS and high-voltage transistors TR1 to TR8 having gates commonly connected to a transfer gate line TG.

The memory cell array 13 has a plurality of NAND cells 18 arranged in a matrix form. Each of the NAND cells 18 includes eight memory cell transistors MT and selection transistors ST1, ST2. The memory cell transistor MT has a laminated structure which includes a floating gate formed above the main surface of a semiconductor substrate with a gate insulating film disposed therebetween, a gate-gate insulating film formed on the floating gate, and a control electrode formed on the gate-gate insulating film (not shown). Every two adjacent memory cell transistors MT commonly have the source/drain. The memory cell transistors are arranged so that the current paths thereof will be serially connected between the selection transistors ST1 and ST2. The number of memory cell transistors MT is not limited to eight and can be set to 16, 32, for example. Further, both of the selection transistors ST1, ST2 are not always necessary. If one of the NAND cells 18 can be selected, only one of the selection transistors ST1 and ST2 can be provided.

The control electrodes of the memory cell transistors MT arranged on the same column are commonly connected to a corresponding one of the word lines WL1 to WL8. Further, the gates of the selection transistors ST1, ST2 on the same row are respectively and commonly connected to the select gates SGD, SGS. The drains of the selection transistors ST1 on the same row are connected to a corresponding one of bit lines BL1 to BLn. The sources of the selection transistors ST2 are commonly connected to the source line driver 15 via a source line SL.

The sense amplifier 14 is configured to amplify data read out from a selected one of the memory cell transistors MT.

The source line driver 15 is configured to apply voltage to the source line SL.

Next, the high-voltage transistors TR1 to TR8 of the core portion 17 are explained by taking the transistors TR1 to TR4 as an example with reference to FIGS. 2 to 7.

Figure 2:
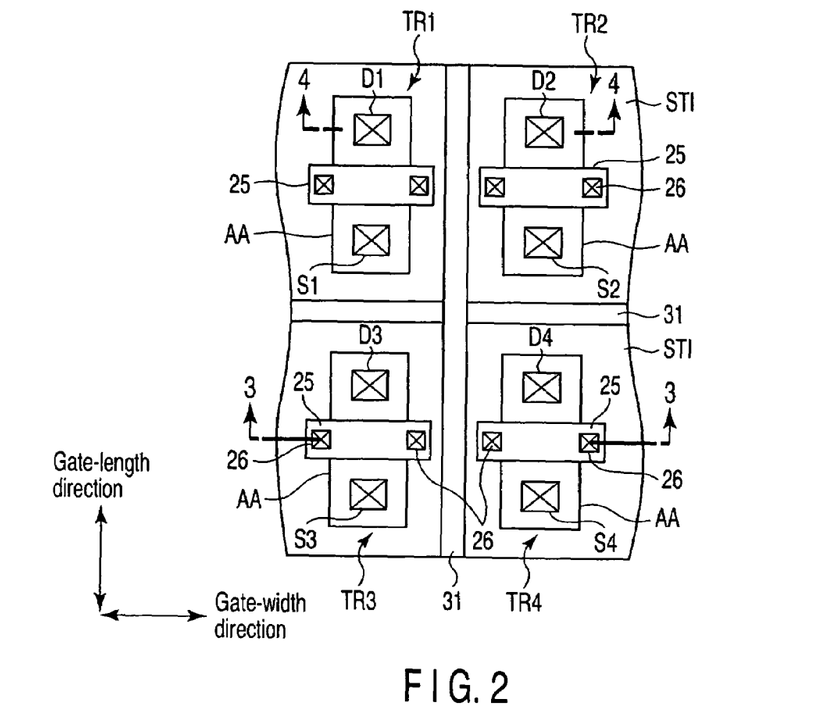
FIG. 2 is a plan view schematically showing high-voltage transistors in a core portion of the row decoder of the semiconductor device according to the first embodiment of this invention.
Figure 3:
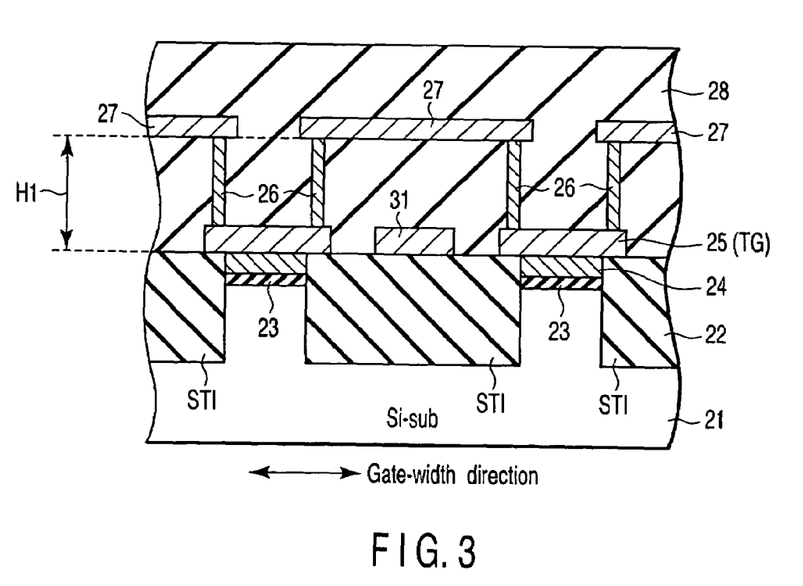
FIG. 3 is a cross-sectional view taken along the 3—3 line of FIG. 2.
Figure 4:
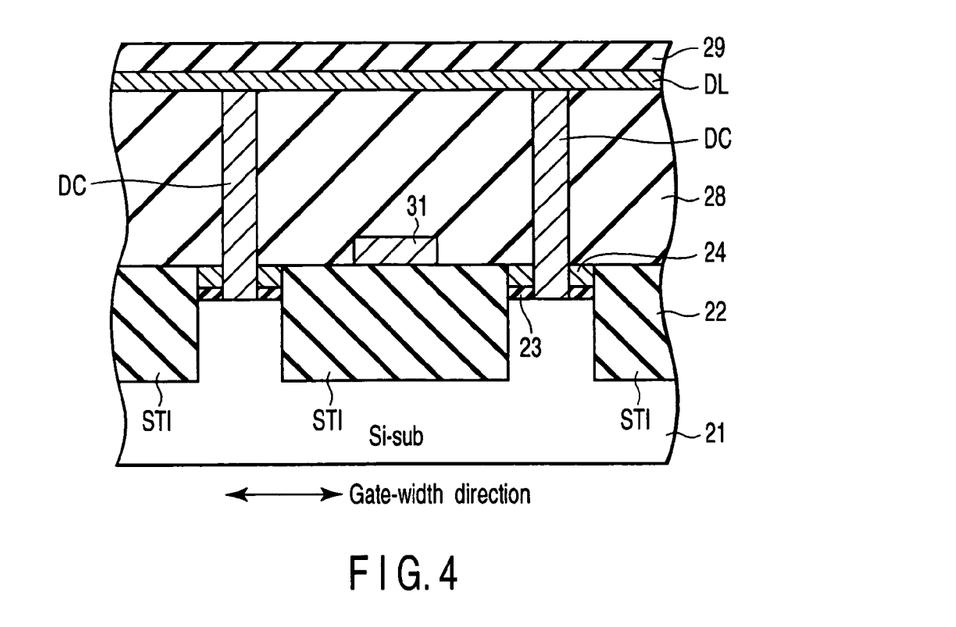
FIG. 4 is a cross-sectional view taken along the 4—4 line of FIG. 2.

FIG. 2 is a plan view schematically showing the high-voltage transistors TR1 to TR4. FIG. 3 is a cross-sectional view taken along the 3—3 line of FIG. 2. FIG. 4 is a cross-sectional view taken along the 4—4 line of FIG. 2.

As shown in the drawing, the high-voltage transistors TR1 to TR4 are formed in respective element regions AA which are isolated by an element isolation region STI (shallow trench isolation region) formed on the main surface of a semiconductor substrate 21.

The transistors TR1 to TR4 respectively have gate insulating films 23 formed on the substrate 21, floating electrode layers 24 formed on the respective gate insulating films 23, control electrode layers 25 formed on the respective floating electrode layers 24 and sources S1 to S4/drains D1 to D4 which are isolated from one another and arranged to sandwich the corresponding gate electrodes. Contacts are formed on the respective sources S1 to S4 and drains D1 to D4 to apply desired potentials thereto. For example, as shown in FIG. 4, drain contacts DC are formed to penetrate through the insulating layer 28, floating electrode layers and gate insulating films 23 to reach the surface of the substrate 21 and electrically connected to a wiring layer DL. As described above, the transfer gate line TG is configured by the control electrode layer 25. For example, the floating electrode layer 24 and control electrode layer 25 are formed of polysilicon.

The floating electrode layers 25 are isolated for the respective transistors TR1 to TR4 and formed on the element regions AA. Gate electrode contacts 26 are formed on portions (fringe portions) which are formed by extending the floating electrode layer 25 in the gate-width direction onto the element isolation region STI. Each of wiring layers 27 is formed on the gate electrode layers 26 on the control electrode layers 25 which are adjacent to each other in the gate-width direction so as to electrically connect the transfer gate lines TG arranged in the gate-width direction.

Further, shielding gates 31 are formed on portions of the element isolation region STI which lie between the transistors TR1 to TR4 adjacent to one another in the gate-length direction and gate-width direction. In other words, the shielding gates 31 are formed to surround the transistors TR1 to TR4 on the element isolation region STI. The shielding gate 31 is grounded and applied with 0V or applied with preset negative bias voltage.

The shielding gate 31 may be formed only in one of the gate-length direction and gate-width direction.

Further, the control electrode layer 25 are electrically connected to the transfer gate line TG via a wiring layer (not shown). The contacts of the sources S1 to S4 and drains D1 to D4 are applied with desired potentials via wiring layers (not shown).

<Operation (Self-Boost Method)>

Figure 5:
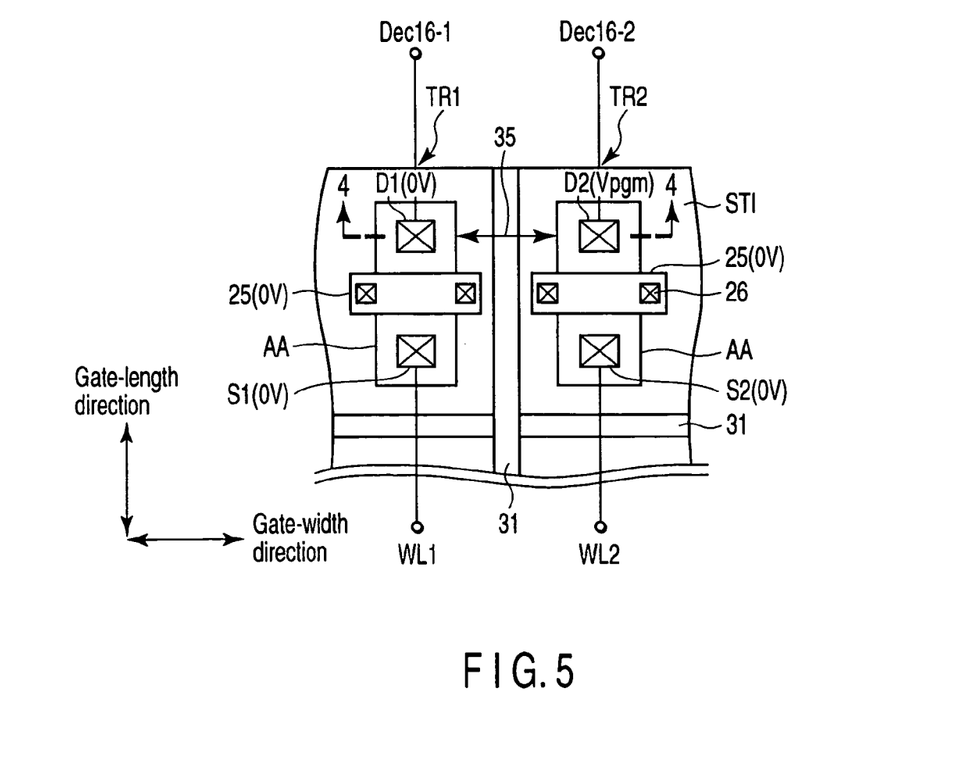
FIG. 5 is a plan view for illustrating the operation of the high-voltage transistors of the semiconductor device according to the first embodiment.
Figure 6:
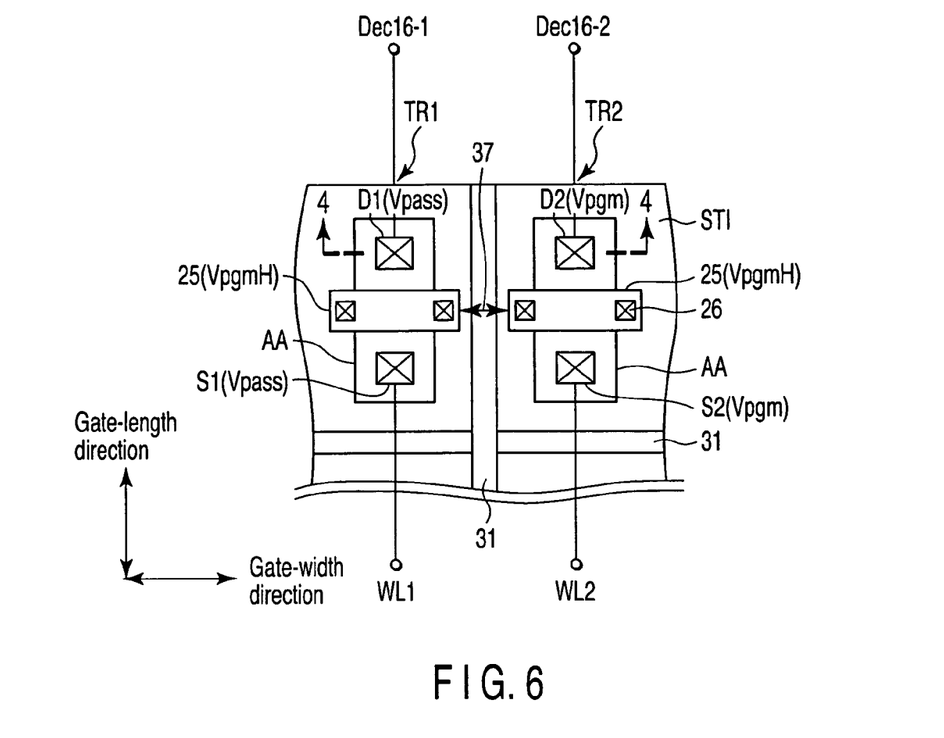
FIG. 6 is a plan view for illustrating the operation of the high-voltage transistors of the semiconductor device according to the first embodiment.

Next, the operation of the high-voltage transistors TR1 to TR8 in a case where data is programmed into the memory cell transistor MT by use of the self-boost method is explained below. The program operation is simultaneously performed for all of the memory cell transistors MT (one PAGE) connected to a corresponding one of the word lines WL1 to WL8. A case wherein data is programmed into the memory cell transistor MT2 shown in FIG. 1 is explained by using the transistors TR1, TR2. FIGS. 5 and 6 are plan views for illustrating the operation of the transistors TR1, TR2.

First, a voltage of 0V is applied to the bit line BL1 and Vcc is applied to the bit lines BL2 to BLn to select one of the NAND cells 18 which is connected to the bit line BL1.

Then, as shown in FIG. 5, before the transfer gate line TG is selected, the transistors TR1, TR2 are set in the OFF state and the sources S1, S2 are applied with no potential (0V) or set in an electrically floating state. Next, in order to select the memory cell transistor MT which is connected to the word line WL2, program voltage Vpgm (which is approximately 25V, for example) which is supplied from part Dec16-2 of the row main decoder circuit portion 16 is applied to the drain D2. At this time, since the transistor TR1 which is adjacent to the transistor TR2 in the gate-width direction with part of the element isolation region STI disposed therebetween is not selected, voltage is not supplied from part Dec16-1 of the row main decoder circuit portion 16 and no voltage is applied to the drain D1 (0V).

With the above bias relation, high-voltage (which is approximately program voltage Vpgm) is applied to a space region 35 of the element isolation region between the drains D1 and D2. A shielding gate 31 which is applied with 0V or negative potential is formed on the space region 35 of the element isolation region between the drains D1 and D2. Thus, a sufficiently high degree of element isolation is attained in the space region 35 of the element isolation region and occurrence of a so-called punchthrough leak is prevented.

Next, intermediate potential Vpass is applied to the drain D1. Further, potential VpgmH (which is equal to Vpgm+ Vth, for example, approximately 26V) used to transfer program voltage Vpgm to the word line WL2 is applied to the transfer gate line TG. By application of the potential VpgmH, the transistors TR1, TR2 are turned on. Then, the intermediate potential Vpass and program voltage Vpgm are respectively transferred to the word line WL1 (non-selected word line) and word line WL2 (selected word line).

With the above bias relation, the high-voltage Vpgm is applied to a space region 37 of the element isolation region which lies below the transfer gate line TG extending in the gate-width direction. A shielding gate 31 which is applied with 0V or negative potential is formed on the space region 37 of the element isolation region. Thus, occurrence of a phenomenon that a channel is formed in the space region 37 of the element isolation region and a current flows therethrough, that is, so-called field inversion, is prevented.

Further, the transfer gate transistors TGTD, TGTS are also turned on by application of the potential VpgmH. Then, potential Vcc is transferred to the selected select gate line SGD and 0V is transferred to the non-selected select gate line SGS. The operations of the other transistors TR3 to TR8 are the same as that of the transistor TR1.

Therefore, the transistor ST1 and memory cell transistor MT1 to which the potential Vcc and intermediate potential Vpass are transferred are turned on. Thus, potential 0V of the bit line BL1 is applied to the substrate in which the memory cell transistor MT2 is formed. Further, electrons are injected into the floating electrode (not shown) of the memory cell transistor by applying program voltage Vpgm transferred to the control gate (not shown) of the memory cell transistor MT2. Thus, the program operation is performed.

As described above, in the semiconductor device according to the present embodiment, the shielding gates 31 which apply 0V or negative potential to the element isolation region STI are formed on portions of the element isolation region STI between the transistors TR1 to TR4 which are adjacent in the gate-length direction and gate-width direction.

Therefore, even in a case where the high-voltage (which is approximately equal to the program voltage Vpgm) is applied to the space region of the element isolation region between the drains D1 and D2 (FIG. 5) or where the high potential VpgmH is applied to the space region 37 of the element isolation region which lies below the transfer gate lines TG in the gate-width direction (FIG. 6), occurrence of inversion layers in the space regions 35, 37 is prevented.

Thus, occurrence of field inversion and occurrence of a punchthrough leak can be prevented. Therefore, occurrence of a short circuit and extra power consumption due to the field inversion and punchthrough leak can be suppressed and the reliability can be enhanced.

Further, the above effect can be attained not only in the space between the transistors which are adjacent in the gate-width direction but also in the space between the transistors (for example, the space between the transistors TR1 and TR3 and the space between the transistors TR2 and TR4) which are adjacent in the gate-length direction if the same bias relation is set.

Since the degree of element isolation is enhanced by the above effect, it is not necessary to increase the distances of the element isolation region STI between the transistors TR1 to TR4 which are adjacent in the gate-length direction and gate-width direction. Therefore, the area of the element isolation region STI in the gate-length direction and gate-width direction can be reduced and is advantageous for miniaturization.

As a result, the cell area of the core portion 17 can be reduced. In this case, the rate of the cell area of the core portion 17 which occupies the whole area of the NAND flash memory 11 is high. Therefore, the factor of the core portion 17 which is advantageous for miniaturization is advantageous for a reduction in the cell area of the NAND flash memory 11.

The control electrode layers 25 are isolated for the respective transistors TR1 to TR4. The control electrode layers 25 of the transistors TR which are adjacent in the gate-width direction are electrically connected to each other via the wiring layer 27 and the gate electrode contacts 26 having the length H1.

Therefore, the effective depth of the element isolation region STI can be increased by H1 and the reliability can be enhanced by enhancing the degree of element isolation.

As described above, by positively forming the shielding gates 31 on portions of the element isolation region STI which lie between the transistors TR1 to TR4 adjacent to one another in the gate-length direction and gate-width direction, the punchthrough leak and field inversion can be prevented and the reliability can be enhanced.

Further, the gate electrode contacts 26 are formed on portions (fringe portions) which are formed by extending the floating electrode layer 25 in the gate-width direction onto the element isolation region STI.

Therefore, it is advantageous in preventing the floating electrode layer 24 from being etched and damaged when the gate electrode contacts 26 are formed in the insulating layer 28 by use of an anisotropic etching process such as an RIE (reactive ion etching) process, for example.

[Modification 1]

Figure 7:
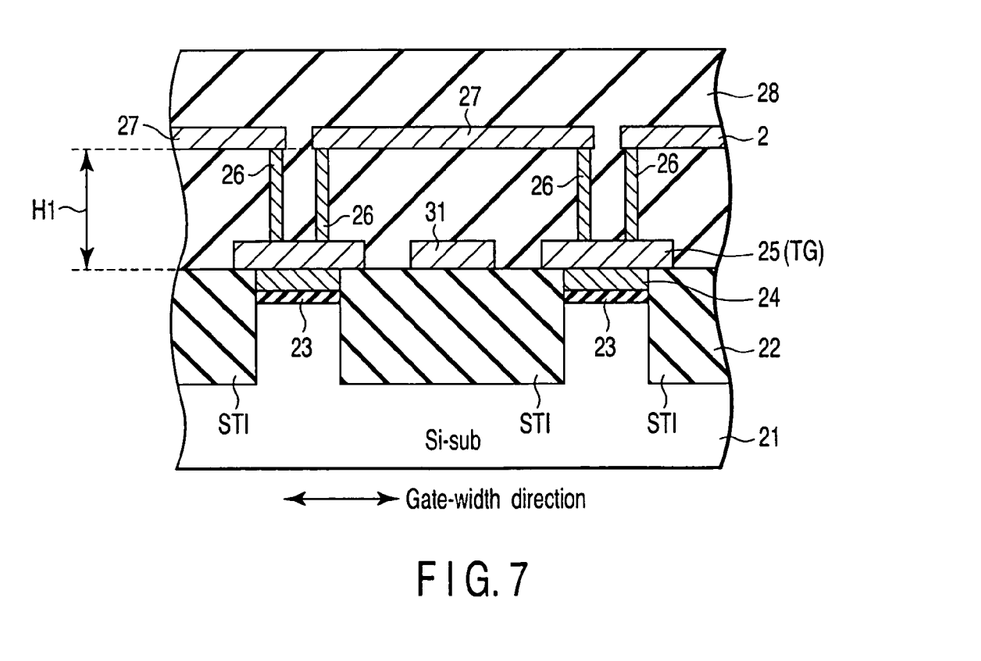
FIG. 7 is a cross-sectional view schematically showing high-voltage transistors of the semiconductor device according to a modification 1 of this invention.

Next, a semiconductor device according to a modification 1 of this invention is explained with reference to FIG. 7. In the following explanation, the explanation for portions which are the same as those of the first embodiment is omitted. FIG. 7 is a cross-sectional view schematically showing the semiconductor device according to the modification 1 and is a cross-sectional view taken in the same direction as that of FIG. 3.

As shown in FIG. 7, in the semiconductor device according to the modification 1, gate electrode contacts 26 are formed on gate electrodes (the control electrode layers 25) on element regions AA.

With the above configuration, the same effect as that of the first embodiment can be attained. Further, in the semiconductor device according to the modification 1, the gate electrode contacts 26 are formed on gate electrodes (the control electrode layers 25) on the element regions AA. Therefore, the fringe portions in the gate-width direction can be made small by not forming the gate electrode contacts 26 on so-called fringe portions of the control gates 25. As a result, the cell area in the gate-width direction can be reduced and is advantageous for miniaturization.

Further, since the distance between the gate electrode contacts 26 which are adjacent in the gate-width direction can be set long to a certain extent, voltage applied from the gate electrode contact 26 to the element isolation region STI can be lowered. In addition, it is advantageous in preventing potentials of transistors which are adjacent in the gate-width direction from becoming unstable.

[Second Embodiment]

Figure 8:
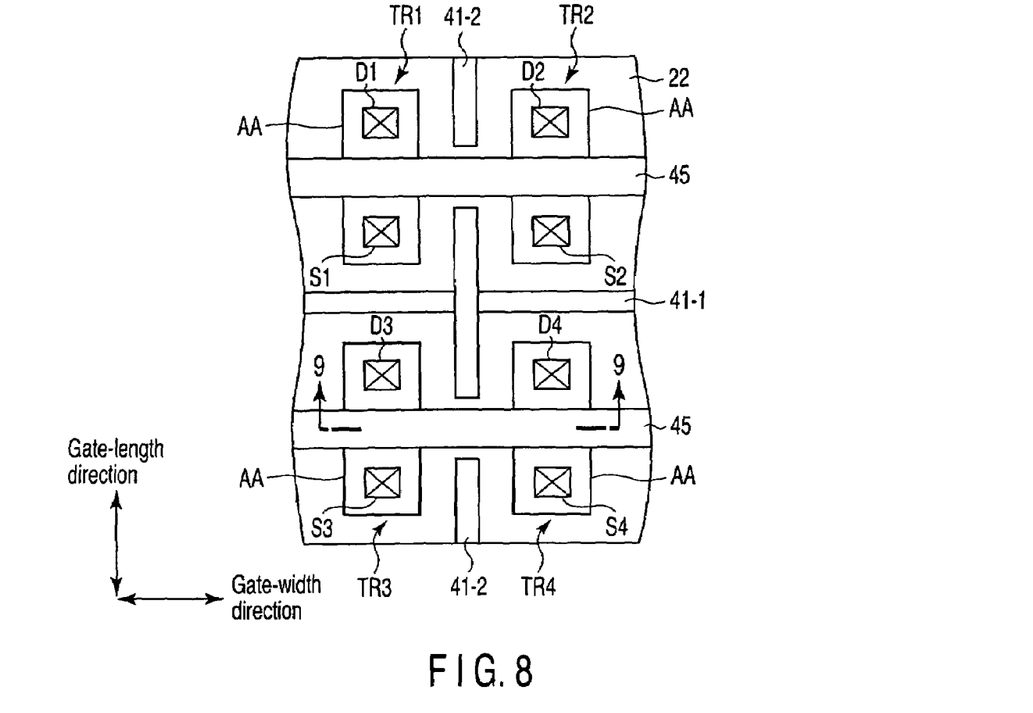
FIG. 8 is a plan view schematically showing high-voltage transistors of a semiconductor device according to a second embodiment of this invention.
Figure 9:
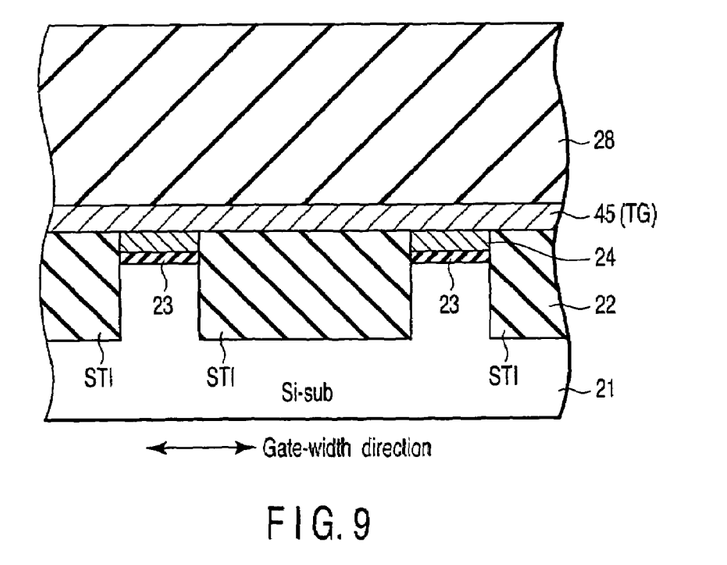
FIG. 9 is a cross-sectional view taken along the 9—9 line of FIG. 8.

Next, a semiconductor device according to a second embodiment of this invention is explained with reference to FIGS. 8 and 9. In the following explanation, the explanation for portions which are the same as those of the first embodiment is omitted. FIG. 8 is a plan view schematically showing the semiconductor device according to the second embodiment. FIG. 9 is a cross-sectional view taken along the 9—9 line of FIG. 8.

In the semiconductor device according to the second embodiment, transistors TR1–TR2 and transistors TR3–TR4 which are arranged in the gate-width direction are formed to respectively and commonly have control electrode layers 45. Therefore, the gate electrode contacts 26 formed in the semiconductor device according to the first embodiment are not formed in the second embodiment.

Further, shielding gates 41-1, 41-2 are formed on portions of the element isolation region STI for the transistors TR1 to TR4 which are adjacent in the gate-length direction and gate-width direction except portions of the element isolation region on which the control electrode layers 45 are formed. In other words, the shielding gates 41-1, 41-2 are formed to surround the transistors TR1 to TR4 on portions of the element isolation region other than portions of the element isolation region on which the control electrode layers 45 are formed. The shielding gate 41-1, 41-2 is used to apply 0V or preset negative bias voltage to the portions of the element isolation region other than portions of the element isolation region on which transfer gate lines TG are formed. Further, the control electrode layers 45 are electrically connected to the transfer gate lines TG (not shown).

With the above configuration, the same effect as that of the first embodiment can be attained. Further, the shielding gates 41-1, 41-2 are formed on portions of the element isolation region STI for the transistors TR1 to TR4 which are adjacent in the gate-length direction and gate-width direction except the portions of the element isolation region on which the control electrode layers 45 are formed. In addition, the shielding gate 41-1, 41-2 is used to apply 0V or preset negative bias voltage to the portions of the element isolation region other than the portions of the element isolation region on which the control electrode layers 45 are formed.

Therefore, occurrence of the so-called punchthrough leak and field inversion can be prevented by the same action as described above. As a result, the reliability can be enhanced.

Further, the shielding gate 41-1, 41-2 is not formed on portions of the element isolation region STI on which transfer gate lines TG are formed. Therefore, even in a case where the distance between the transistors TR1–TR2 and transistors TR3–TR4 which are adjacent in the gate-width direction cannot be set sufficiently long, it is possible to prevent the control electrode layer 45 and shielding gate 41-1, 41-2 from being brought into contact with each other and causing a short circuit. Further, even if the distance between the transistors TR1–TR2 and transistors TR3–TR4 which are adjacent in the gate-width direction is short, the insulating property can be enhanced. Therefore, it is advantageous in reducing the cell area in the gate-width direction.

Further, the transistors TR1–TR2 and transistors TR3–TR4 arranged in the gate-width direction commonly have the control electrode layers 45. Therefore, it is not necessary to provide the gate electrode contacts 26 as in the first embodiment. As a result, the semiconductor device can be easily formed and it is advantageous in lowering the manufacturing cost.

[Third Embodiment]

Figure 10:
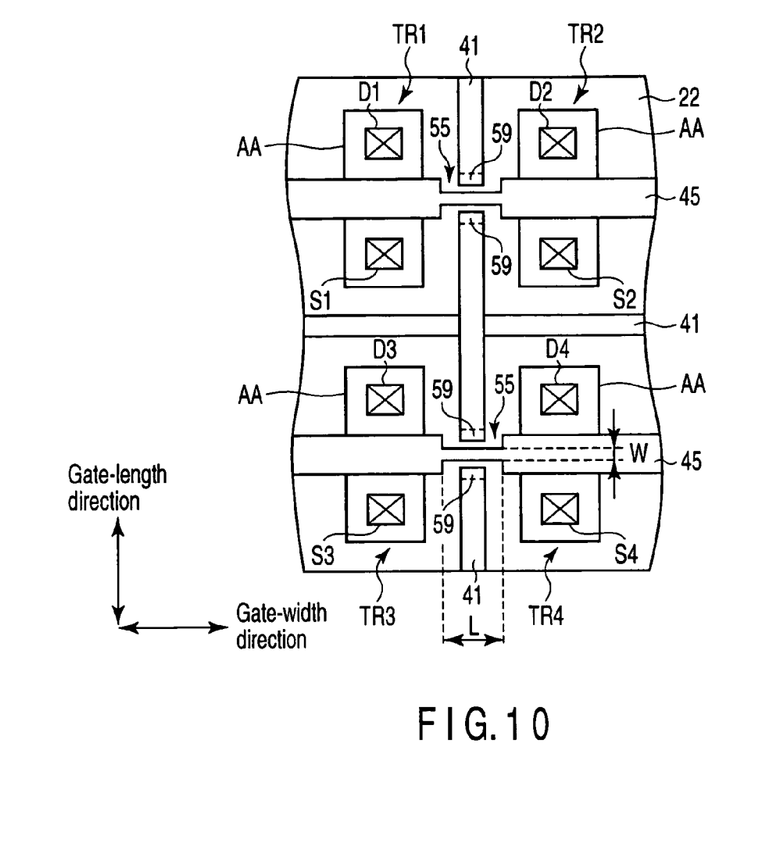
FIG. 10 is a plan view schematically showing high-voltage transistors of a semiconductor device according to a third embodiment of this invention.
Figure 11:
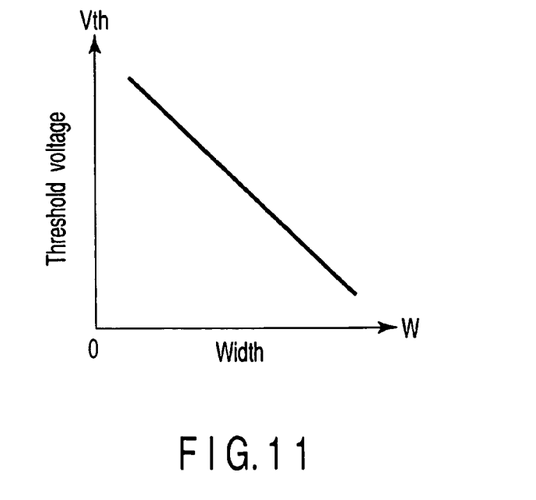
FIG. 11 is a diagram schematically showing the relation between the threshold voltage Vth and the width W in the gate-length direction of the high-voltage transistor of the semiconductor device according to the third embodiment of this invention.

Next, a semiconductor device according to a third embodiment of this invention is explained with reference to FIGS. 10 and 11. In the following explanation, the explanation for portions which are the same as those of the first, second embodiments and the modification 1 is omitted. FIG. 10 is a plan view schematically showing the semiconductor device according to the third embodiment. FIG. 11 is a diagram schematically showing the relation between the threshold voltage Vth and the width W in the gate-length direction of a control electrode layer 45 of the semiconductor device according to the third embodiment.

In the semiconductor device according to the third embodiment, transistors TR1–TR2 and transistors TR3–TR4 which are arranged in the gate-width direction are formed to commonly have the control electrode layers 45. The control electrode layers 45 each have a portion 55 whose width W is made small in the gate-length direction on an element isolation region STI. Further, shielding gates 41 have arm portions 59 which are formed to extend in the gate-length direction to positions near the portions 55.

With the above configuration, the same effect as that of the second embodiment can be attained. Further, in the semiconductor device according to the third embodiment, the control electrode layers 45 are formed to have the portions 55 whose width W is made small. In this case, if the length of the control electrode layer 45 in the gate-width direction is set to L and the width thereof in the gate-length direction is set to W, then the width W can be set small and the length L can be set constant as in the semiconductor device according to the second embodiment. Therefore, the threshold voltage Vth can be enhanced by the so-called narrow channel effect as shown in FIG. 11. As a result, occurrence of field inversion can be more stably prevented and the reliability can be enhanced.

Further, the shielding gate 41 has the arm portions 59 which are formed to extend in the gate-length direction to positions near the portions 55. Therefore, since the shielding gate 41 can be formed nearer to a portion of the element isolation region STI in which field inversion may occur, occurrence of field inversion can be more stably prevented and the reliability can be enhanced.

[Modification 2]

Figure 12:
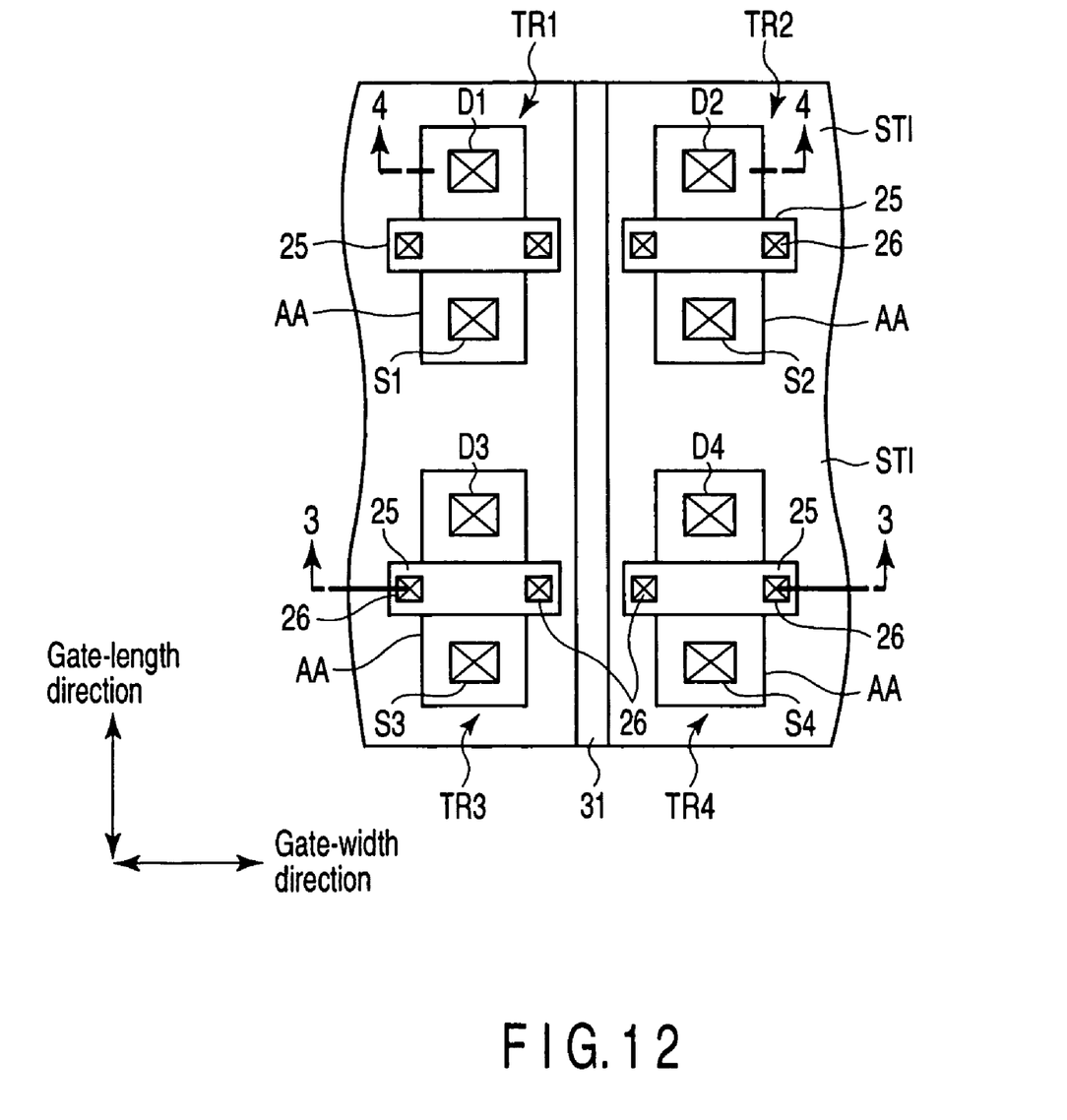
FIG. 12 is a plan view schematically showing high-voltage transistors of the semiconductor device according to a modification 2 of this invention.

Next, a semiconductor device according to a modification 2 of this invention is explained with reference to FIG. 12. In the following explanation, the explanation for portions which are the same as those of the first, second embodiments and the modification 1 is omitted. FIG. 12 is a plan view showing the semiconductor device according to the modification 2.

As shown in FIG. 12, in the semiconductor device according to the present modification, shielding gates 31 are formed only on portions of an element isolation region STI which correspond to spaces between transistors (TR1 and TR2, TR3 and TR4) which are adjacent in the gate-width direction.

Therefore, the withstand voltage against field inversion which may occur with the strongest possibility in a space portion between the transistors in the gate-width direction can be enhanced.

Further, shielding gates 31 are not formed on portions of the element isolation region STI which correspond to spaces between the transistors (TR1 and TR3, TR2 and TR4) which are adjacent in the gate-length direction.

Therefore, it is advantageous that the cell area in the gate-length direction can be reduced because the shielding gates 31 are not formed.

In the first to third embodiments and the modifications 1, 2, the N-type high-voltage MOS field effect transistors (MOSFETs: metal oxide semiconductor field-effect transistors) TR1 to TR8 formed in the core portion 17 of the row decoder 12 of the NAND flash memory are explained as an example. However, it is also possible to apply this invention to P-type transistors. In a case where this invention is applied to the P-type transistors, a voltage applied to the shielding gates 31 is a positive bias voltage (voltage of a polarity different from that of a voltage applied to the gate to turn on the current path of the transistor) or reference voltage. Further, this invention can be applied not only to the row decoder but also to high-voltage insulated-gate field-effect transistors formed in a portion different from the row decoder.

Further, this invention is not limited to the NAND type circuit and can be applied to high-voltage MOS field effect transistors formed in a core portion of a row decoder of a NOR flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a plurality of high-voltage insulated-gate field-effect transistors arranged in a matrix form on a main surface of a semiconductor substrate and each having a gate electrode, a gate electrode contact formed on the gate electrode, and a wiring layer which is formed on the gate electrode contacts adjacent in a gate-width direction to electrically connect the gate electrodes arranged in the gate-width direction; and
shielding gates which are provided on portions of an element isolation region which lie between the transistors adjacent in the gate-width direction and gate-length direction and used to apply one of a reference potential and a potential of a polarity different from that of potential applied to the gate of the transistor to turn on a current path of the transistor to the element isolation region.

2. The semiconductor device according to claim 1, wherein the gate electrode contacts are formed on fringe portions formed by extending end portions of the gate electrode onto the element isolation region in the gate-width direction.

3. The semiconductor device according to claim 1, wherein the gate electrode contacts are formed on the gate electrode on an element region.

4. The semiconductor device according to claim 1, wherein the high-voltage insulated-gate field-effect transistors are provided in a core portion of a row decoder formed near a memory cell array.

5. The semiconductor device according to claim 4, wherein the memory cell array includes a plurality of memory cell transistors which each have a laminated structure having a floating electrode, a gate-gate insulating film formed on the floating electrode, and a control electrode formed on the gate-gate insulating film, every adjacent two of the transistors commonly having a source/drain and current paths thereof being serially connected, and the plurality of high-voltage insulated-gate field-effect transistors supply program voltages to the control electrodes of the plurality of memory cell transistors.

* * * * *